(12) United States Patent (10) Patent No.: US 8,872,560 B2
Morishita et al. (45) Date of Patent: Oct. 28, 2014

(54) SEMICONDUCTOR DEVICE HAVING DATA OUTPUT CIRCUIT IN WHICH SLEW RATE THEREOF IS ADJUSTABLE

(71) Applicant: Elpida Memory, Inc., Tokyo (JP)

(72) Inventors: Yoshihito Morishita, Tokyo (JP); Tetsuya Arai, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/710,626

(22) Filed: Dec. 11, 2012

(65) Prior Publication Data

US 2013/0162302 A1 Jun. 27, 2013

(30) Foreign Application Priority Data

Dec. 21, 2011 (JP) ................. 2011-279788

(51) Int. Cl.
*H03K 5/12* (2006.01)
*H03K 3/00* (2006.01)
*H03K 19/003* (2006.01)

(52) U.S. Cl.
CPC .. *H03K 5/12* (2013.01); *H03K 3/00* (2013.01); *H03K 19/00361* (2013.01)
USPC .......................................... 327/170; 326/82

(58) Field of Classification Search
None
See application file for complete search history.

(56) References Cited

U.S. PATENT DOCUMENTS

| 5,568,081 | A | 10/1996 | Lui et al. | |
|---|---|---|---|---|
| 5,872,737 | A | 2/1999 | Tsuruda et al. | |
| 6,323,687 | B1 | 11/2001 | Yano | |
| 7,224,179 | B2 | 5/2007 | Kim | |
| 7,622,986 | B2* | 11/2009 | Pan et al. | 327/563 |
| 7,821,289 | B2* | 10/2010 | Lee | 326/27 |
| 2002/0030509 | A1* | 3/2002 | Sakata et al. | 326/83 |
| 2005/0135168 | A1 | 6/2005 | Kim | |
| 2008/0211548 | A1* | 9/2008 | Hayashi et al. | 327/108 |

FOREIGN PATENT DOCUMENTS

JP 2005-182994 A 7/2005

* cited by examiner

*Primary Examiner* — Cassandra Cox
(74) *Attorney, Agent, or Firm* — Sughrue Mion, PLLC (57) ABSTRACT

Disclosed herein is a device that includes: a first circuit configured to operate on a first power voltage to produce a first set of slew rate control signals; a second circuit configured to operate on a second power voltage to produce a second set of slew rate control signals in response to the first set of slew rate control signals; and a third circuit configured to operate on the second power voltage to produce a signal at a rate that is controllable in response to the second set of slew rate control signals.

20 Claims, 10 Drawing Sheets

FIG.5A  SDP0

FIG.5B  L1,L2 POTENTIAL

FIG.5C  SSP

FIG.5D  NETOP

FIG.5E  SDQ0

FIG.6A  SDP0

FIG.6B  L1,L2 POTENTIAL

FIG.6C  SPP

FIG.6D  NETOP

FIG.6E  SDQ0

FIG.7A   SDP0

FIG.7B   L1,L2 POTENTIAL

FIG.7C   SSP

FIG.7D   NETOP

FIG.7E   SDQ0

FIG.8A  SDP0

FIG.8B  L1,L2 POTENTIAL

FIG.8C  SPP

FIG.8D  NETOP

FIG.8E  SDQ0

SEMICONDUCTOR DEVICE HAVING DATA OUTPUT CIRCUIT IN WHICH SLEW RATE THEREOF IS ADJUSTABLE

BACKGROUND OF THE INVENTION

1. Field of the Invention

The present invention relates to a semiconductor device and more particularly to a semiconductor device provided with a slew rate control signal generating circuit.

2. Description of Related Art

In recent years, some semiconductor devices are provided with a slew rate control signal generating circuit (refer to Japanese Patent Application Laid-open No. 2005-182994, for example). The slew rate control signal generating circuit controls slew rate of an output circuit in accordance with a slew rate control signal so that delay times at a rising edge coincides with a falling edge of an output waveform on a receiver side.

In the aforementioned kind of semiconductor device, power supply noise may occur in a source power that is supplied to an output buffer circuit caused by changing an output data signal. A power supply for supplying a source power to the output buffer circuit may be provided independently of a power supply for supplying a source power to other circuits in order to prevent the power supply noise from propagating. Since source power supplied to a circuit for generating the slew rate control signal differs from source power supplied to an output buffer circuit which receives the slew rate control signal in such a semiconductor device, however, there is a problem that it is difficult to precisely control slew rate of the output buffer circuit if noise occurs in the source power supplied to the output buffer circuit.

SUMMARY

In one embodiment, there is provided a device that includes: an output terminal; a driver circuit configured to drive the output terminal to one of first and second voltages supplied from first and second source lines, respectively; a control circuit configured to generate a first control signal and operating on third and fourth voltages supplied from third and fourth source lines that are provided independently of the first and second source lines; and a buffer circuit configured to receive the first control signal to generate a second control signal and operating on the first and second voltages supplied from the first and second source lines. The driver circuit is configured to control a slew rate thereof based on the second control signal.

In another embodiment, there is provided a device that includes: an output terminal; a first transistor coupled between the output terminal and a first source line; a second transistor coupled between the output terminal and a second source line; a first circuit configured to supply a first data signal to a control electrode of the first transistor, the first data signal taking one of first and second logic levels based on a third data signal; a second circuit configured to supply a second data signal to a control electrode of the second transistor, the second data signal taking one of the first and second logic levels based on a fourth data signal; a third circuit configured to control a changing speed of the first control signal from the first logic level to the second logic level based on a first slew rate control signal on a first signal line; a fourth circuit configured to control a changing speed of the second control signal from the second logic level to the first logic level based on a second slew rate control signal on a second signal line; a first buffer circuit configured to generate the first slew rate control signal such that the first signal line is connected to one of the first and second source lines; and a second buffer circuit configured to generate the second slew rate control signal such that the second signal line is connected to one of the first and second source lines.

In still another embodiment, a device includes a first circuit configured to operate on a first power voltage to produce a first set of slew rate control signals, a second circuit configured to operate on a second power voltage to produce a second set of slew rate control signals in response to the first set of slew rate control signals, and a third circuit configured to operate on the second power voltage to produce a signal at a rate that is controllable in response to the second set of slew rate control signals.

DETAILED DESCRIPTION OF THE EMBODIMENTS

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

First Embodiment

The first embodiment of the present invention is described hereunder with reference to the accompanying drawings.

Figure 1:
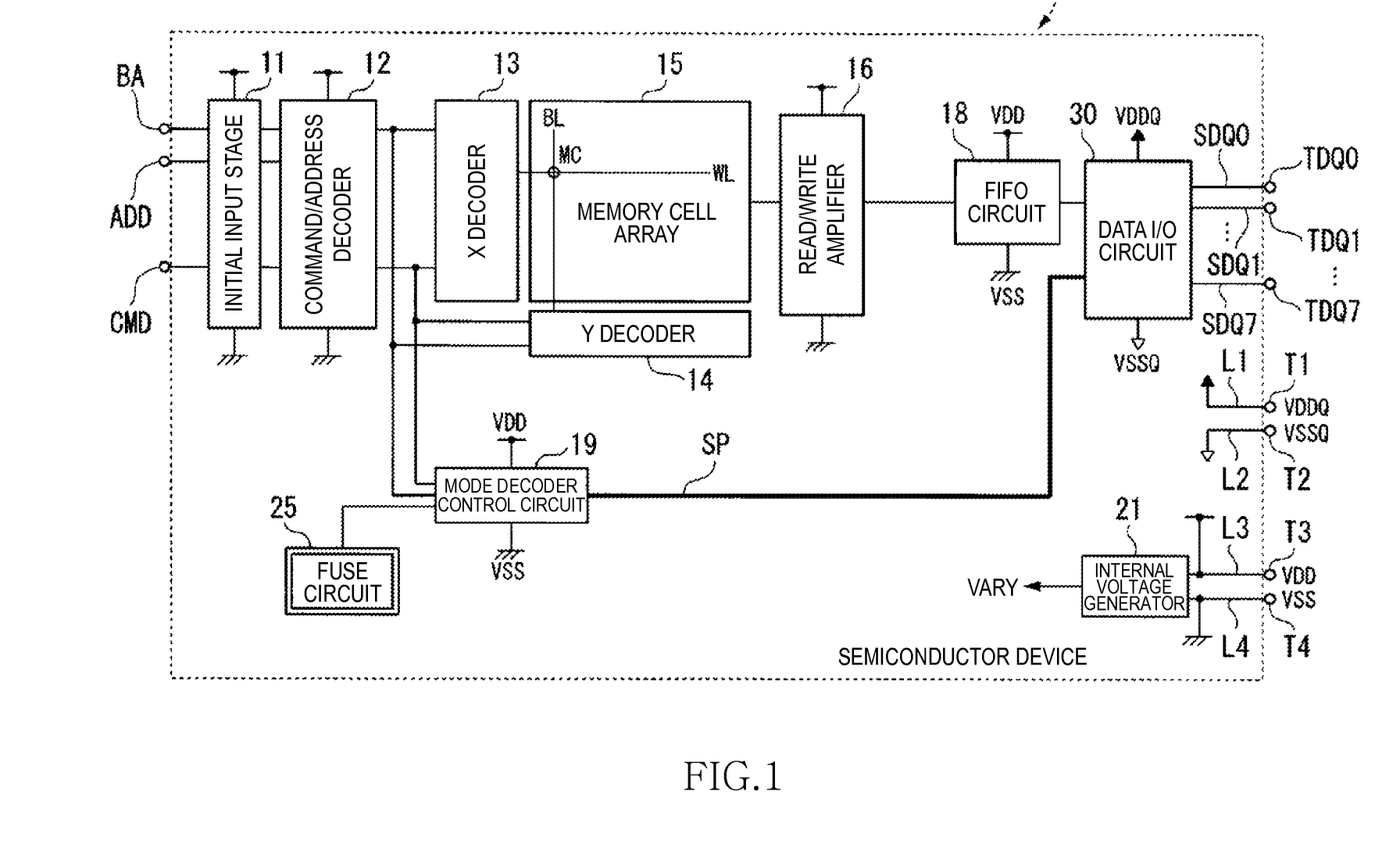
FIG. 1 is a block diagram indicative of the configuration of a semiconductor device according to a first embodiment of the present invention.

Referring now to FIG. 1, the semiconductor device 1 of this embodiment includes an initial input stage 11, a command/ address decoder 12, an X-decoder 13, a Y-decoder 14, a memory cell array 15, a read/write amplifier 16, a first-in, first-out (FIFO) circuit 18, a mode decoder control circuit 19, an internal voltage generator 21, a fuse circuit 25 and a data input/output circuit 30.

The initial input stage 11 is an input circuit for address signals and command signals, for example, which includes bank address signals supplied via bank address input terminals BA, address signals supplied via address input terminals ADD and command signals supplied via command input terminals CMD from the outside of the semiconductor device 1. The command signal may include a write command which instructs the semiconductor device 1 to write data supplied from an external device into the memory cell array 15 and a read command which instructs the semiconductor device 1 to read data from the memory cell array 15 to an external device, for example. The initial input stage 11 outputs the bank address signal, address signal and commands to the command/address decoder 12.

The command/address decoder 12 latches the bank address signal and the address signal supplied from the initial input stage 11 and decodes latched these addresses. The command/address decoder 12 also latches the command signals supplied from the initial input stage 11 and decodes the latched command signals. Also, the command/address decoder 12 outputs decoding results of the address signal to the X-decoder 13 and the Y-decoder 14 as internal address signals including row address signals and column address signals. Here, each of the row address signals is used for selecting a row of the memory cell array 15 while each of the column address signals is used for selecting a column of the memory cell array 15. The command/address decoder 12 also outputs decoding results of the command signal as internal command signals to the X-decoder 13, the Y-decoder 14 and the mode decoder control circuit 19 which will be described later.

The memory cell array 15 has bit lines BL, word lines WL, and memory cells MC disposed at intersection of the bit lines BL and the word lines WL. Each of the memory cells MC may be constituted of a transistor and a storage capacitor.

The X-decoder 13 receives the row address signals among the internal address signals supplied from the command/address decoder 12. The X-decoder 13 decodes the row address signals and selects any one of the word lines WL provided in the memory cell array 15 in accordance with the results of decoding.

The Y-decoder 14 receives the column address signals among the internal address signals supplied from the command/address decoder 12. The Y-decoder 14 decodes the column address signals and selects one of the bit lines BL provided in the memory cell array 15 in accordance with the results of decoding.

During a read operation, the read/write amplifier 16 reads data from the memory cell MC selected by the X-decoder 13 and the Y-decoder 14 and transfers the data to the FIFO circuit 18. Also, during a write operation, the read/write amplifier 16 acquires data supplied from the FIFO circuit 18 and writes the acquired data into the memory cell MC selected by the X-decoder 13 and the Y-decoder 14.

The FIFO circuit 18 may include a shift register for successively transferring data read out from the memory cells MC by the read/write amplifier 16 to the data input/output circuit 30 during each read operation. Also, the FIFO circuit successively transfers data output from the data input/output circuit 30 to the read/write amplifier 16 during each write operation.

The fuse circuit 25 may include programmable nonvolatile memory elements. Conditions which will optimize slew rate of the data input/output circuit 30 when the data input/output circuit 30 is operated are stored in the fuse circuit 25 in advance.

The mode decoder control circuit 19 outputs a pre-slew rate control signal SP corresponding to the internal address signal and the internal command signal to the data input/output circuit 30. The mode decoder control circuit 19 of the present embodiment selects a pre-slew rate control signal SP that complies with such parameters as burst length, latency and slew rate from among pre-slew rate control signals SP stored in the fuse circuit 25 and outputs the selected pre-slew rate control signal SP to the data input/output circuit 30. The pre-slew rate control signal SP herein means a signal which will be output in accordance with programmed information obtained by determining the conditions which will optimize the slew rate in test mode and programming such conditions in the fuse circuit 25, for example.

The internal voltage generator 21 is connected to a third connecting terminal T3 via a third source line L3 and to a fourth connecting terminal T4 via a fourth source line L4, respectively. The third connecting terminal T3 is supplied with a power source voltage VDD (e.g., 1.2 V). The fourth connecting terminal T4 is supplied with a ground voltage VSS (e.g., 0 V). Also, the internal voltage generator 21 generates source power VARY that is supplied to the memory cell array 15 as one of power voltages, the other of which may be ground voltage VSS. The source voltage VDD and the ground voltage VSS may be supplied to the circuit blocks 11-14, 16, 18, 19 and 25 as respective power voltages.

The data input/output circuit 30 is connected to data terminals TDQ0-TDQ7. The data input/output circuit 30 acquires data read out by the read/write amplifier 16 from the memory cells MC through the FIFO circuit 18 during each read operation in the read mode and transmits output data signals SDQ0-SDQ7 corresponding to the acquired data through the data terminals TDQ0-TDQ7, respectively. Also, during each write operation in the write mode, the data input/output circuit 30 outputs data signals supplied through the data terminals TDQ0-TDQ7 to the read/write amplifier 16 through the FIFO circuit 18. The data input/output circuit 30 is connected to a first connecting terminal T1 via a first source line L1 and to a second connecting terminal T2 via a second source line L2, whereby source voltages VDDQ and VSSQ are supplied, respectively. It should be noted that the power voltage supply lines from the terminals T1 and T2 to the data input/output circuit 30 are provided independently to other power voltage supply lines from the terminals T3 and T4 to the circuit blocks 11-14, 16, 18, 19 and 25 and from the generator to the cell array 15.

Figure 2:
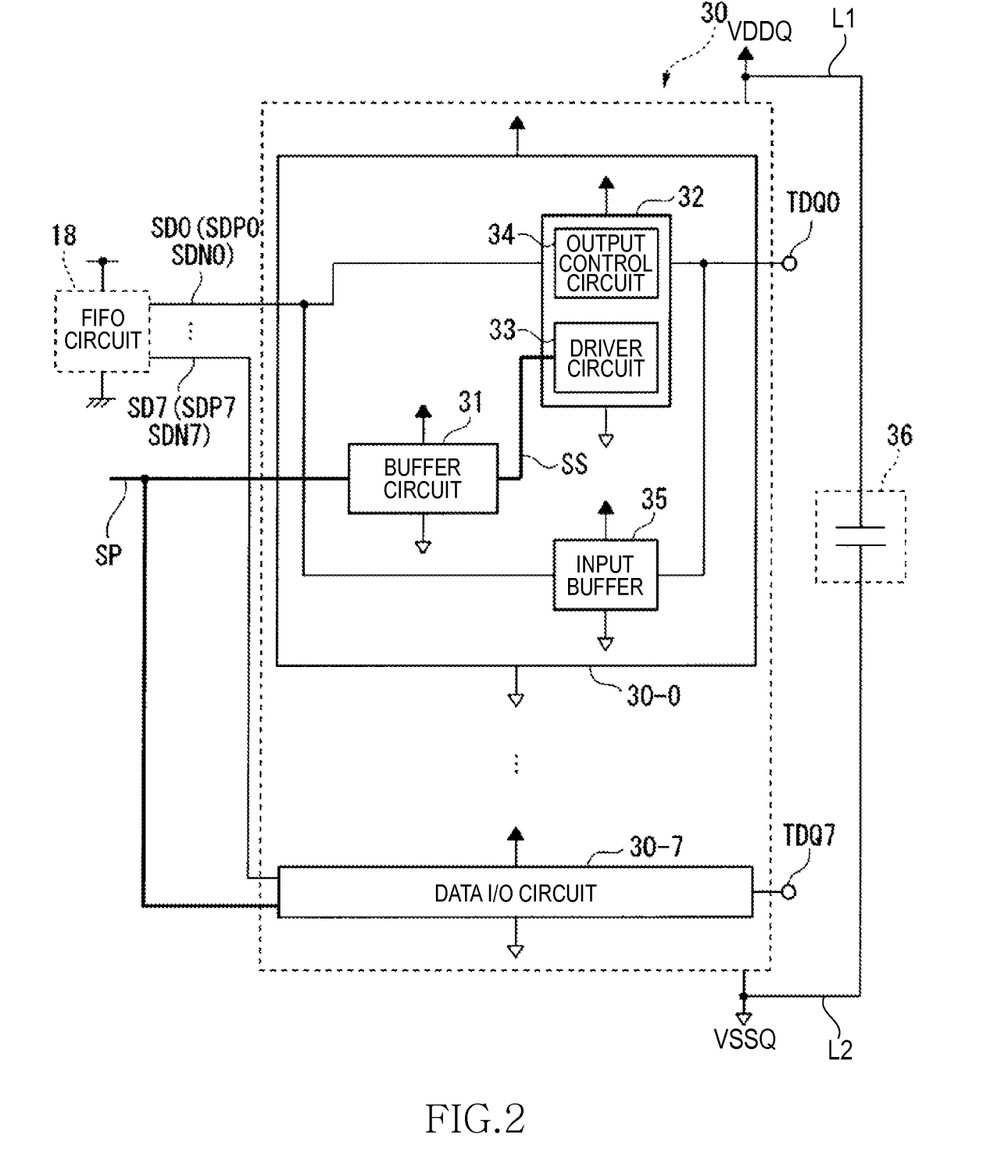
FIG. 2 is a block diagram indicative of the circuit configuration of the data input/output circuit shown in FIG. 1.

Next, the configuration of the data input/output circuit 30 is, as shown in FIG. 2, provided with a capacitor 36 between the first source (or power voltage supply) line L1 supplied with the power source voltage VDDQ and the second source (or power voltage supply) line L2 supplied with the ground voltage VSSQ. The power source voltage VDDQ may have the same voltage as the power source voltage VDD that is 1.2V, for example. The ground voltage VSSQ may have the same voltage as the ground voltage VSS that is 0V, for example.

The data input/output circuit 30 includes data input/output circuits 30-0 to 30-7 which correspond to the data terminals TDQ0-TDQ7, respectively. Since the data input/output circuits 30-0 to 30-7 have the same configuration, the following discussion focuses on the configuration and working of the data input/output circuit 30-0. The data input/output circuit 30-0 includes a buffer circuit 31, an output buffer 32 and an input buffer 35.

The input buffer 35 is connected to the data terminal TDQ0 and the FIFO circuit 18. The input buffer 35 outputs the data signal supplied via the data terminal TDQ0 to the FIFO circuit 18.

The output buffer 32 includes a driver circuit 33 and an output control circuit 34. The output buffer 32 will be described later with reference to FIG. 4.

Figure 3:
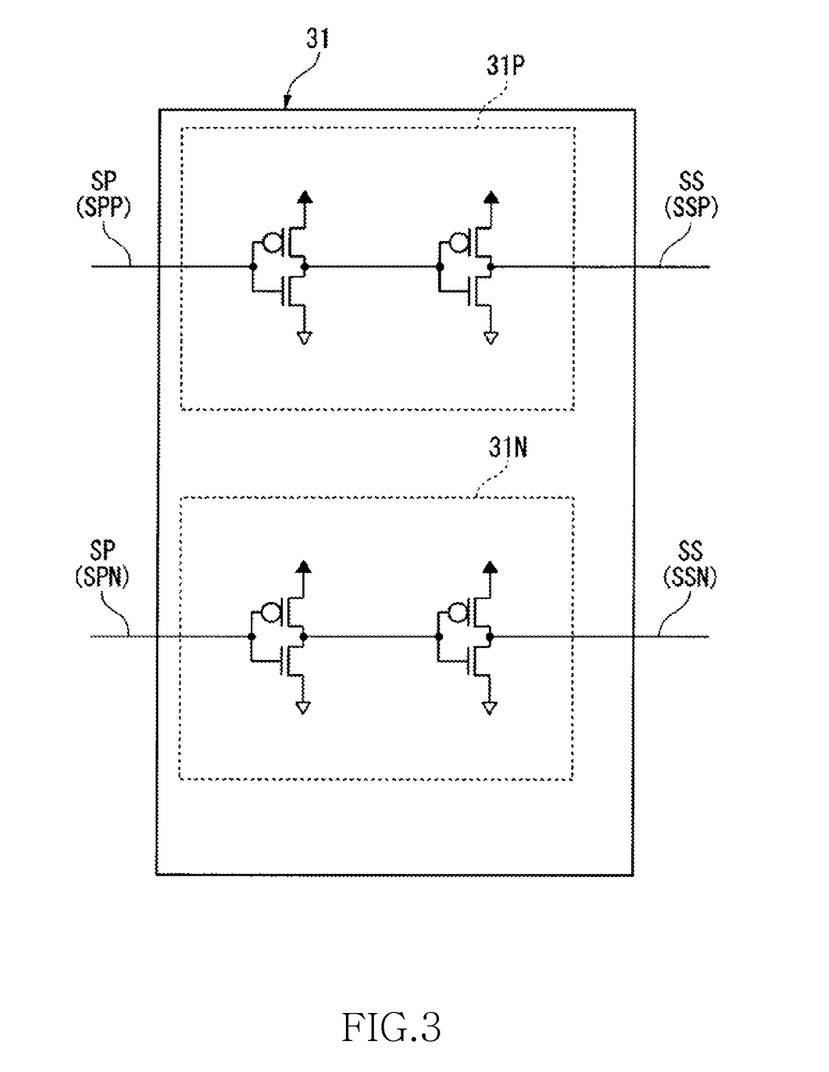
FIG. 3 is a circuit diagram indicative of the circuit configuration of the buffer circuit shown in FIG. 2.

As shown in FIG. 3, the buffer circuit 31 includes a P-side buffer circuit 31P and an N-side buffer circuit 31N. The pre-slew rate control signal SP produced by the control circuit 19 (see FIG. 1) includes a P-side pre-slew rate control signal SPP and an N-side pre-slew rate control signal SPN. Also, a slew rate control signal SS produced by the buffer circuit 31 includes a P-side slew rate control signal SSP and an N-side slew rate control signal SSN. Since the P-side and N-side circuits herein have the same configuration, the following discussion focuses on the P-side circuit.

The P-side buffer circuit 31P operates on the source voltage VDDQ (first source voltage: e.g., 1.2 V) and the ground voltage VSSQ (second source voltage: e.g., 0 V) and receives the signals SPP produced by the circuit 19 operating on the source voltage VDD and the ground voltage VSS. Accordingly, the P-side buffer circuit 31P converts the signal level (e.g., amplitude) of the P-side pre-slew rate control signal SPP, that corresponds to the source voltage VDD (third source voltage) and the ground voltage VSS (fourth source voltage), into a signal level of the P-side slew rate control signal SSP, that corresponds to the source voltage VDDQ (first source voltage) and the ground voltage VSSQ (second source voltage), the P-side slew rate control signal SSP thus converted in level being then supplied to the output buffer 32.

Figure 4:
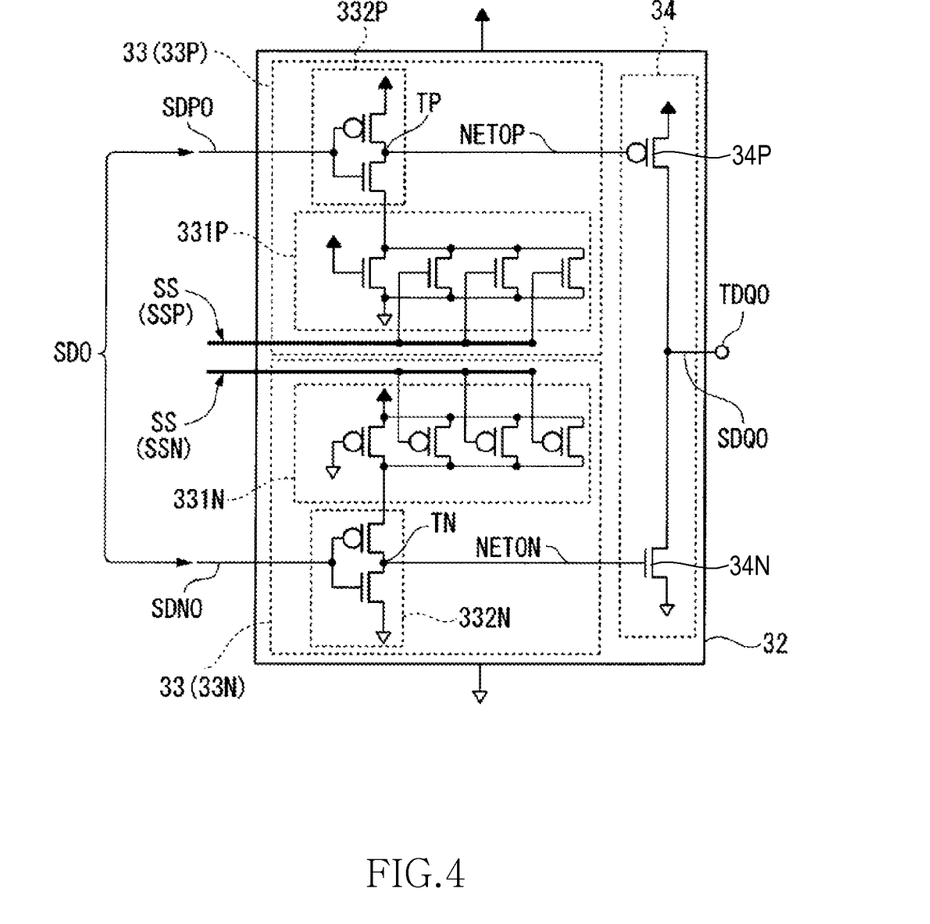
FIG. 4 is a circuit diagram indicative of the circuit configuration of the output buffer shown in FIG. 2.

As shown in FIG. 4, the output buffer 32 includes the driver circuit 33 (e.g., the P-side driver circuit 33P and the N-side driver circuit 33N) and the output control circuit 34.

The output control circuit 34, which is connected to the driver circuit 33, includes a P-channel transistor 34P and an N-channel transistor 34N to output the output data signal SDQ0 corresponding to a data signal SD0 (including a P-side data signal SDP0 and an N-side data signal SDN0) fed from the FIFO circuit 18 to the data terminal TDQ0. If the P-side data signal SDP0 and the N-side data signal SDN0 are both at a High level, for example, the output control circuit 34 of this embodiment sets the output data signal SDQ0 to High. Contrary to this, if the P-side data signal SDP0 and the N-side data signal SDN0 are both at a Low level, for example, the output control circuit 34 sets the output data signal SDQ0 to Low. Also, if the P-side data signal SDP0 is at the Low level and the N-side data signal SDN0 is at the High level, the output control circuit 34 sets the data terminal TDQ0 to a high impedance state, neither the High level nor Low level being transferred at the data terminal TDQ0.

The driver circuit 33 includes the P-side driver circuit 33P and the N-side driver circuit 33N. The output control circuit 34 includes a P-side output control circuit or transistor 34P and an N-side output control circuit or transistor 34N. Since the P-side and N-side circuits herein have a symmetrical configuration, the following discussion focuses on the P-side circuit.

The P-side driver circuit 33P includes a P-side slew rate regulator circuit 331P and a P-side buffer circuit 332P.

The P-side buffer circuit 332P receives the P-side data signal SDP (e.g., the P-side data signal SDP0) and outputs a P-side drive signal NET0P which is obtained by controlling the slew rate of the input P-side data signal SDP0.

The P-side slew rate regulator circuit 331P which is connected to the P-side buffer circuit 332P controls the slew rate of the signal NET0P (and accordingly, P-side circuit 34P) in accordance with the input slew rate control signal SS. The P-side slew rate regulator circuit 331P of this embodiment is made up of a plurality of control transistors (e.g., n-channel metal oxide semiconductor (NMOS) transistors), which are connected in parallel to each other between the circuit 332P and the ground. The P-side slew rate regulator circuit 331P thus configured controls the slew rate of the P-side drive signal NET0P by controlling the amount of current that flows through an output terminal TP of the P-side buffer circuit 332P by setting ON/OFF states of the control transistors in accordance with a plurality of ON/OFF control signals corresponding respectively to the plurality of control transistors that are contained in the input slew rate control signal SS.

The larger the number of transistors which are turned on among the NMOS control transistors included in the P-side slew rate regulator circuit 331P, for example, the larger the amount of current that flows through the output terminal TP. Therefore, the slew rate (gradient) of the P-side drive signal NET0P becomes larger in this case. On the other hand, the smaller the number of transistors which are turned on among the NMOS control transistors included in the P-side slew rate regulator circuit 331P, the smaller the slew rate (gradient) of the P-side drive signal NET0P. The slew rate is controlled in this fashion in accordance with the number of control transistors which are turned on. The number of control transistors which are turned on is controlled by the mode decoder control circuit 19 in the aforementioned manner. The number of transistors which are turned on is predetermined in the test mode so that the slew rate is optimized.

The driver circuit 33 controls the slew rate of the output signal of the output control circuit 34 as described above. The above explanation applies also to the N-side circuit.

As discussed with reference to FIG. 1, the data input/output circuit 30 (including the circuits contained in the data input/output circuit 30) operates on the source voltage VDDQ (first source voltage) supplied through the first connecting terminal T1 and the ground voltage VSSQ (second source voltage) supplied through the second connecting terminal T2 in this embodiment. Here, the first connecting terminal T1 which is connected to the first source line L1 is a source power input terminal through which the first source voltage is supplied from outside the semiconductor device 1 to the first source line L1. Also, the second connecting terminal T2 which is connected to the second source line L2 is a source power input terminal through which the second source voltage is supplied from outside the semiconductor device 1 to the second source line L2.

On the other hand, each of the initial input stage 11, the command/address decoder 12, the read/write amplifier 16, the FIFO circuit 18, the mode decoder control circuit 19 and the internal voltage generator 21 operates on the source voltage VDD (third source voltage) supplied through the third connecting terminal T3 and the ground voltage VSS (fourth source voltage) supplied through the fourth connecting terminal T4 in this embodiment. Here, the third connecting terminal T3 which is connected to the third source line L3 is a source power input terminal through which the third source voltage is supplied from outside the semiconductor device 1 to the third source line L3. Also, the fourth connecting terminal T4 which is connected to the fourth source line L4 is a source power input terminal through which the forth source voltage is supplied from outside the semiconductor device 1 to the fourth source line L4.

The source voltage VDDQ and the ground voltage VSSQ for the data input/output circuit 30 are supplied thereto independently of source voltages for the other circuits as described above to suppress propagation of power supply noise to the other circuits.

Referring now to FIGS. 5A to 5E, operation of the semiconductor device 1 of the present embodiment is described. FIGS. 5A to 5E are graphs representing an example of operating waveforms of the semiconductor device 1 which will be observed if a voltage drop (noise) occurs when the NMOS control transistors of the P-side slew rate regulator circuit 331P are controlled to turn off with the P-side slew rate control signal SSP set to Low in this embodiment.

Here, there can be a case where power supply noise occurs in the source voltage VDDQ or the ground voltage VSSQ depending on a data pattern output by the output buffer 32. For example, there can arise a case where noise is generated in source voltages as represented by waveform WN1D and waveform WN1S in FIG. 5B in the first source line L1 and the second source line L2, respectively, when the P-side data signal SDP0 is switched from the Low level (i.e., the potential level of the ground voltage VSS) to the High level (i.e., the potential level of the source voltage VDD) as represented by waveform WS1 in FIG. 5A. More specifically, noise can occur, causing a voltage drop of the source voltage VDDQ, when the data signals output from the output buffers 32 corresponding to the individual data output terminals TDQ0-TDQ7 are switched from the Low level to the High level all at once, for example. Since the decoupling capacitor 36 is connected between the first source line L1 and the second source line L2 in this embodiment, the potential level of the ground voltage VSSQ is lowered owing to coupling noise which is generated as a result of a voltage drop of the source voltage VDDQ. There can also be a case where the potential level of the ground voltage VSSQ drops owing to power supply noise caused by ringing when the data signals output from the individual output buffers 32 corresponding to the data output terminals (TDQ1-TDQ7) other than the relevant data output terminal (TDQ0) are switched from the High level to the Low level all at once, for example.

Here, the data input/output circuit 30 of the embodiment includes the buffer circuit 31 as described earlier. This buffer circuit 31 (e.g., the P-side buffer circuit 31P) converts the P-side pre-slew rate control signal SPP of which signal level (e.g., amplitude) corresponds to the source voltage VDD (third source voltage) and the ground voltage VSS (fourth source voltage) into the P-side slew rate control signal SSP of which signal level corresponds to the source voltage VDDQ (first source voltage) and the ground voltage VSSQ (second source voltage), and outputs the P-side slew rate control signal SSP to the output buffer 32. Therefore, when the potential levels of the source voltage VDDQ and the ground voltage VSSQ drop, the potential level of the P-side slew rate control signal SSP also drops correspondingly to the potential drop in the source voltage VDDQ and the ground voltage VSSQ as represented by waveform WSSP1 in FIG. 5C.

This means that even if the potential level of the waveform WN1S drops as a result of the occurrence of power supply noise in the ground voltage VSSQ of a source power supply of the NMOS control transistors, the potential level of the waveform WSSP1 also drops in a similar way due to the occurrence of power supply noise in the slew rate control signal SSP because the operating voltage of the slew rate control signal SSP is converted into the ground voltage VSSQ. Therefore, it is possible to precisely control the amount of current that flows through the output terminal TP without causing fluctuations in gate-to-source voltage of the control transistors provided in the driver circuit 33. This further makes it possible to precisely control a drive signal NET0 (e.g., the P-side drive signal NET0P) as represented by waveform WV1 in FIG. 5D. After all, the semiconductor device 1 of this embodiment can precisely control the slew rate. Thus, the data input/output circuit 30 of the embodiment can precisely control the slew rate of each output data signal SDQ (e.g., the output data signal SDQ0) as represented by waveform WD1 in FIG. 5E.

Now, a comparison is made between the semiconductor device 1 of the present embodiment and a semiconductor device that the inventors have conceived as a prototype in the course of making the present invention. The prototype example is not provided with any buffer circuits 31 or decoupling capacitor 36. What is discussed here is a case in which the pre-slew rate control signal SP is input directly into the driver circuit 33 without passing through the buffer circuit 31 in the semiconductor device of the prototype example. Specifically, the following discussion deals with an exemplary case in which the P-side pre-slew rate control signal SPP is not converted into a signal level corresponding to the source voltage VDDQ and the ground voltage VSSQ but is input into the control transistors at a signal level corresponding directly to the source voltage VDD and the ground voltage VSS, for example (FIGS. 6A to 6E).

Figure 5A:
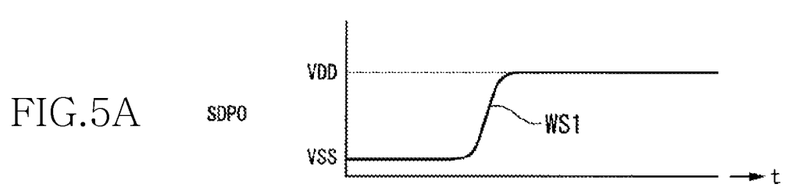
FIGS. 5A to 5E show wave form diagrams of the semiconductor device according to the first embodiment when a voltage drop occurs.
Figure 5B:
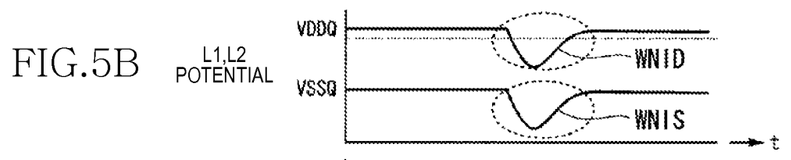
Figure 5C:
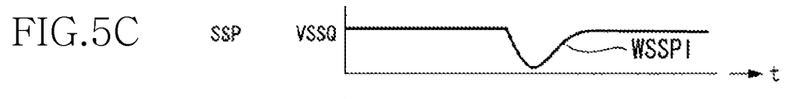
Figure 5D:
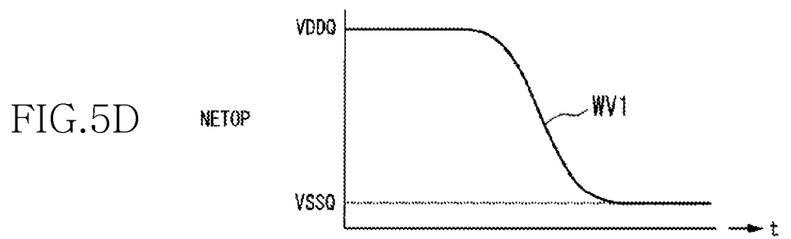
Figure 5E:
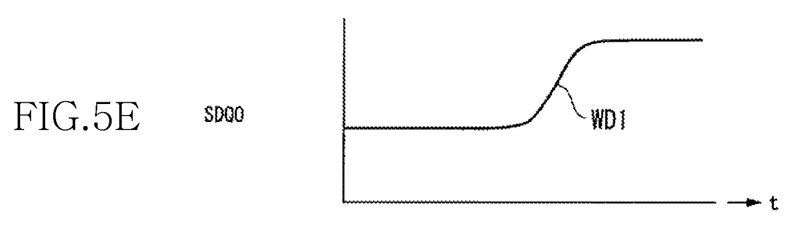
Figure 6A:
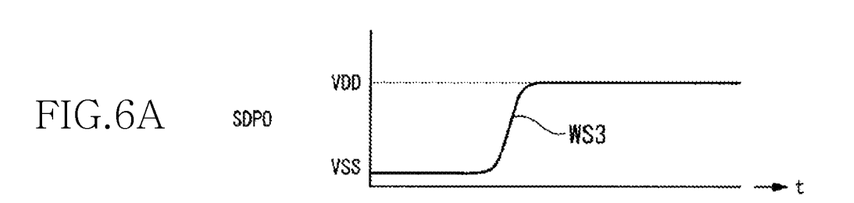
FIGS. 6A to 6E show wave form diagrams of a semiconductor device that the inventors have conceived as a prototype in the course of making the present invention when a voltage drop occurs.
Figure 6B:
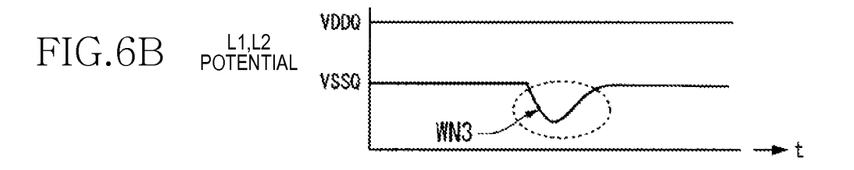

It is now assumed that, as in the above-described case represented in FIG. 5A, power supply noise occurs in the ground voltage VSSQ, causing the voltage of the second source line L2 to vary as represented by waveform WN3 in FIG. 6B, when the P-side data signal SDP0 has been switched from the Low level (i.e., the potential level of the ground voltage VSS) to the High level (i.e., the potential level of the source voltage VDD) as represented by waveform WS3 in FIG. 6A.

Figure 6C:
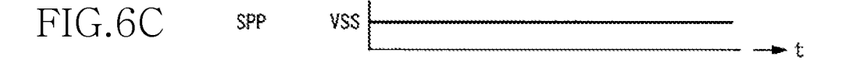
Figure 6D:
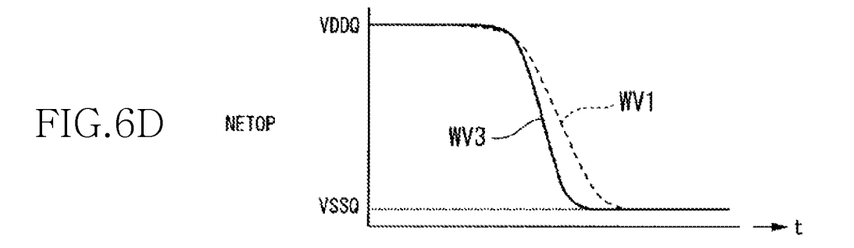

Since the pre-slew rate control signal SP (e.g., the P-side pre-slew rate control signal SPP) is at a signal level corresponding to the source voltage VDD and the ground voltage VSS which are independent of the source voltage VDDQ and the ground voltage VSSQ at this time, no change occurs in the potential level of the P-side pre-slew rate control signal SPP as represented in FIG. 6C.

In this case, the potential level of the P-side slew rate control signal SSP input into the gate of each control transistor does not vary although the potential level of the ground voltage VSSQ of each control transistor of the driver circuit 33 drops. As a result, fluctuations occur in the gate-to-source voltage of the control transistors (because, for example, the gate-to-source voltage of the control transistors increases in a direction in which the control transistors turn on as the potential level of the P-side pre-slew rate control signal SPP input into the gate does not drop although the potential level of the source voltage VDDQ which serves as a source voltage of each control transistor drops in this case) and, therefore, the amount of current that flows through the output terminal TP varies. Thus, the drive signal NET0 (e.g., the P-side drive signal NET0P) deviates from the exact waveform WV1 as represented by waveform WV3 in FIG. 6D. This means that the semiconductor device of this example can not precisely control the slew rate.

Figure 6E:
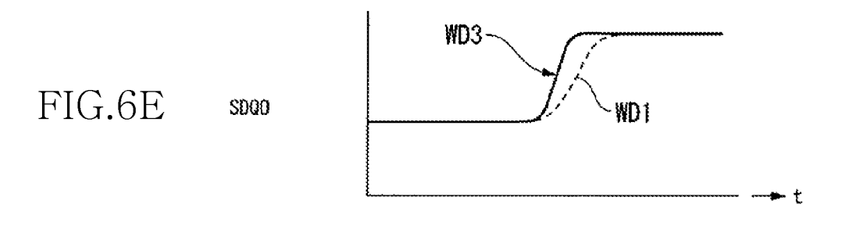

Therefore, the data input/output circuit 30 of this prototype example cannot precisely control (i.e., as represented by the waveform WD1) the slew rate of each output data signal SDQ (e.g., the output data signal SDQ0) as represented by waveform WD3 in FIG. 6E.

As already discussed with reference to FIGS. 5A to 5E, on the other hand, the semiconductor device 1 of this embodiment can precisely control the amount of current that flows through the output terminal TP because the gate-to-source voltage of each control transistor does not fluctuate even when the source voltage VDDQ and the ground voltage VSSQ fluctuate. This means that the semiconductor device 1 of the embodiment can precisely control the slew rate.

As thus far described, the semiconductor device 1 of the present embodiment includes the driver circuits 33, the mode decoder control circuit 19 (control circuit) and the buffer circuits 31. The driver circuits 33 operate on the source voltage supplied through the first source line L1 and the second source line L2 and control the slew rate which drives output terminals (e.g., data output terminals DQ0-DQ7) that are connected to follow at least one of voltages of the first source line L1 and the second source line L2 in accordance with the input slew rate control signal. Also, the control circuit (the mode decoder control circuit 19) operates on the source voltage supplied through the third source line L3 and the fourth source line L4 independent of the source voltage supplied through the first source line L1 and the second source line L2 to generate a principal control signal (e.g., the pre-slew rate control signal SP) on which the slew rate control signal is based. Further, the buffer circuits 31, which operate with the source voltage supplied through the first source line L1 and the second source line L2, generate the slew rate control signal SS on the basis of the principal control signal (e.g., the pre-slew rate control signal SP) and supply the generated slew rate control signal SS to the driver circuits 33.

As a result, the semiconductor device 1 of the present embodiment can generate the principal control signal (e.g., the pre-slew rate control signal SP) by the mode decoder control circuit 19 (control circuit) which operates on the source voltage supplied independently of the source voltage of the output control circuit 34. This enables the semiconductor device 1 of the embodiment to generate the principal control signal (e.g., the pre-slew rate control signal SP) while reducing the influence of fluctuations in the source voltage caused by operation of the output control circuits 34. This means that the semiconductor device 1 of the embodiment can precisely control the slew rate.

Also, the mode decoder control circuit 19 (control circuit) provided in the semiconductor device 1 of the embodiment generates the principal control signal (e.g., the pre-slew rate control signal SP) at a signal level (e.g., amplitude) corresponding to the source voltage supplied through the third source line L3 and the fourth source line L4, and the buffer circuit 31 generates the slew rate control signal SS at a signal level corresponding to the source voltage supplied through the first source line L1 and the second source line L2.

The semiconductor device 1 of the embodiment thus configured can control the slew rate by the slew rate control signal SS even if the source voltage VDDQ and the ground voltage VSSQ fluctuate, the slew rate control signal SS having the potential corresponding to fluctuations in these voltages. Thus, the gate-to-source voltage of the control transistors does not fluctuate, so that the semiconductor device 1 of the embodiment can precisely control the amount of current that flows through the output terminal TP. This means that the semiconductor device 1 of the embodiment can precisely control the slew rate.

The semiconductor device 1 of the embodiment has the first connecting terminal T1, the second connecting terminal T2, the third connecting terminal T3 and the fourth connecting terminal T4. The first connecting terminal T1 is connected to the first source line L1 so that the source voltage VDDQ (first source voltage) fed into the first source line L1 is supplied to the first connecting terminal T1. The second connecting terminal T2 is connected to the second source line L2 so that the ground voltage VSSQ (second source voltage) fed into the second source line L2 is supplied to the second connecting terminal T2. Also, the third connecting terminal T3 is connected to the third source line L3 so that the source voltage VDD (third source voltage) fed into the third source line L3 is supplied to the third connecting terminal T3. Further, the fourth connecting terminal T4 is connected to the fourth source line L4 so that the ground voltage VSS (fourth source voltage) is supplied to the fourth connecting terminal T4.

Referring now to FIGS. 7A to 7E, another example of operation of the semiconductor device 1 of the present embodiment is described. FIGS. 7A to 7E are graphs representing an example of operating waveforms of the semiconductor device 1 which will be observed if a voltage rise (noise) occurs when the NMOS control transistors of the P-side slew rate regulator circuit 331P are controlled to turn on with the P-side slew rate control signal SSP set to High in this embodiment.

As mentioned earlier, there can be a case where power supply noise occurs in the source voltage VDDQ or the ground voltage VSSQ depending on a data pattern output by the output buffer 32. For example, there can arise a case where the voltages of the first source line L1 and the second source line L2 vary as represented by waveform WN2D and waveform WN2S in FIG. 7B, respectively, when the P-side data signal SDP0 is switched from the Low level (i.e., the potential level of the ground voltage VSS) to the High level (i.e., the potential level of the source voltage VDD) as represented by waveform WS2 in FIG. 7A, and when data signals (SD1-SD7) other than the relevant data signal (SD0) are switched from High to Low. This means that when data output from the output buffer 32 corresponding to the relevant data output terminal (TDQ0) varies from Low to High and data individually output from the output buffers 32 corresponding to the data output terminals (TDQ1-TDQ7) other than the relevant data output terminal (TDQ0) vary from High to Low, for example, the potential level of the source voltage VDDQ rises as a result of an increase in the potential level of the ground voltage VSSQ.

The data input/output circuit 30 of this embodiment includes the buffer circuits 31 as described above. The buffer circuit 31 (e.g., the P-side buffer circuit 31P) converts the P-side pre-slew rate control signal SPP of which signal level (e.g., amplitude) corresponds to the source voltage VDD (third source voltage) and the ground voltage VSS (fourth source voltage) into the P-side slew rate control signal SSP of which signal level corresponds to the source voltage VDDQ (first source voltage) and the ground voltage VSSQ (second source voltage), and outputs the P-side slew rate control signal SSP to the output buffer 32. Therefore, when the potential levels of the source voltage VDDQ and the ground voltage VSSQ rise, the potential level of the P-side slew rate control signal SSP also rises correspondingly to the potential rise in the source voltage VDDQ and the ground voltage VSSQ as represented by waveform WSSP2 in FIG. 7C.

In this case, the potential level of the P-side slew rate control signal SSP input into the gate of each control transistor rises in accordance with an increase in the potential level of the ground voltage VSSQ of each control transistor in the driver circuit 33 of this embodiment. It will be recognized from this that the gate-to-source voltage of the control transistors of the driver circuit 33 of this embodiment does not fluctuate and, therefore, it is possible to precisely control the amount of current that flows through the output terminal TP. Accordingly, it is possible to precisely control the slew rate of the drive signal NET0 (e.g., the P-side drive signal NET0P) as indicated by waveform WV2 in FIG. 7D. In short, the semiconductor device 1 of the present embodiment can precisely control the slew rate.

Figure 7A:
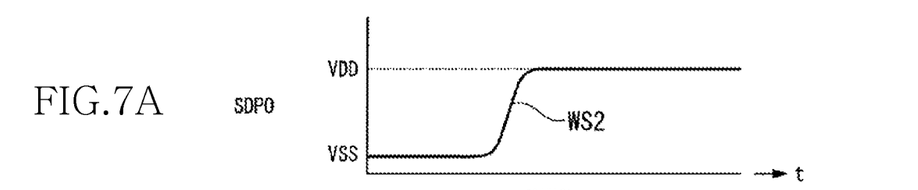
FIGS. 7A to 7E show wave form diagrams of the semiconductor device according to the first embodiment when a voltage rise occurs.
Figures 7B, 7C:
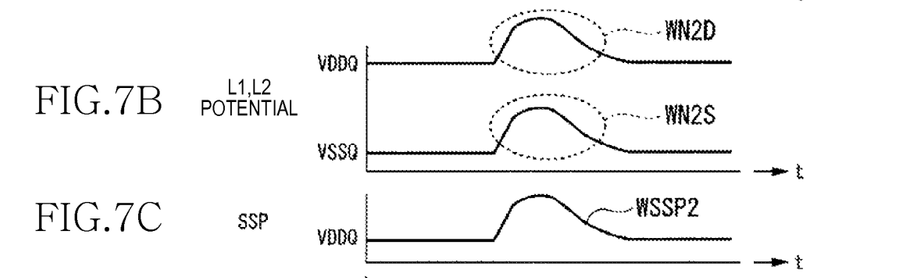
Figure 7D:
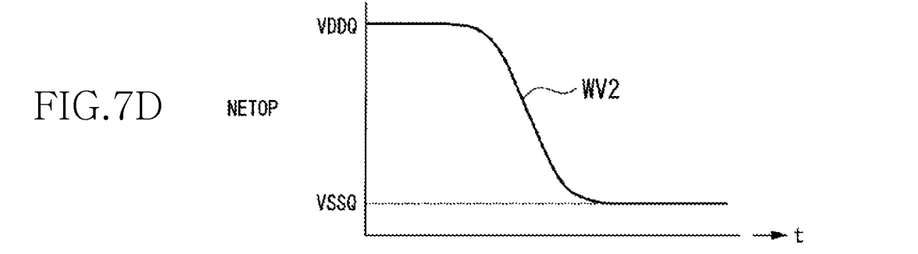
Figure 7E:
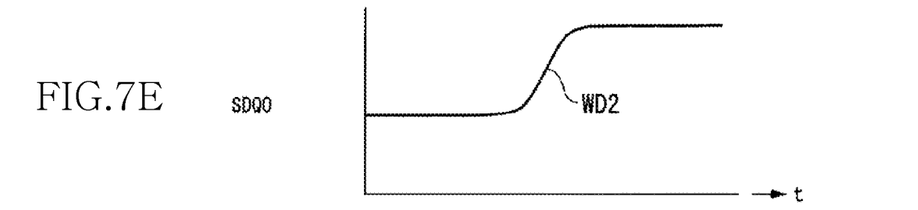

Consequently, the data input/output circuit 30 of this embodiment can precisely control each output data signal SDQ (e.g., the output data signal SDQ0) as represented by waveform WD2 in FIG. 7E even when the ground voltage VSSQ rises.

Now, a comparison is made between the semiconductor device 1 of the present embodiment and a semiconductor device that the inventors have conceived as a prototype in the course of making the present invention. The prototype example is not provided with any buffer circuits 31 or decoupling capacitor 36 of this embodiment. What is discussed here is a case in which the pre-slew rate control signal SP is input into the semiconductor device of the prototype example.

Figure 8A:
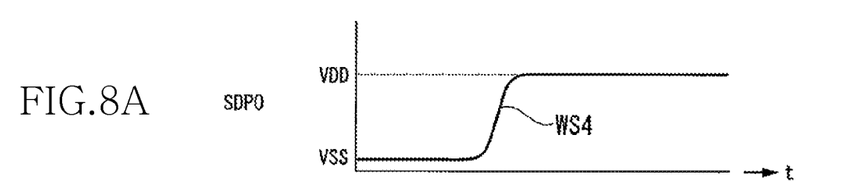
FIGS. 8A to 8E show wave form diagrams of the semiconductor device that the inventors have conceived as a prototype when a voltage rise occurs.
Figure 8B:
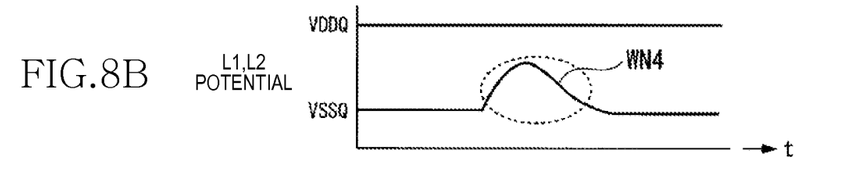

It is now assumed that, as in the above-described case represented in FIG. 7A, the P-side data signal SDP0 is switched from the Low level (i.e., the potential level of the ground voltage VSS) to the High level (i.e., the potential level of the source voltage VDD) as represented by waveform WS4 in FIG. 8A, causing the data signals (SD1-SD7) other than the relevant data signal (SD0) to switch from High to Low. Should this situation occur, there can arise a case where the voltages of the first source line L1 and the second source line L2 vary as represented by waveform WN4 in FIG. 8B.

Figure 8C:
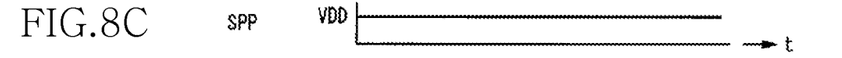
Figure 8D:
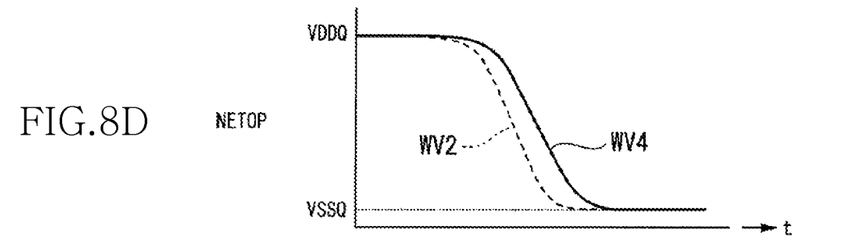

Since the pre-slew rate control signal SP (e.g., the P-side pre-slew rate control signal SPP) is at a signal level corresponding to the source voltage VDD and the ground voltage VSS which are independent of the source voltage VDDQ and the ground voltage VSSQ at this time, no change occurs in the potential level of the P-side pre-slew rate control signal SPP as represented in FIG. 8C.

In this case, the potential level of the P-side slew rate control signal SSP input into the gate of each control transistor does not vary although the potential level of the ground voltage VSSQ of each control transistor of the driver circuit 33 rises. As a result, fluctuations occur in the gate-to-source voltage of the control transistors (in a direction in which the control transistors turn off, for example), causing the amount of current that flows through the output terminal TP to vary and, therefore, the drive signal NET0 (e.g., the P-side drive signal NET0P) deviates from the exact waveform WV2 as represented by waveform WV4 in FIG. 8D. This means that the semiconductor device of this example can not precisely control the slew rate.

Figure 8E:
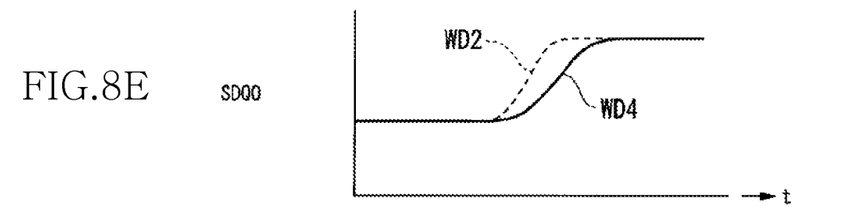

Thus, the data input/output circuit 30 of this example can not precisely control (i.e., as represented by the waveform WD2) each output data signal SDQ (e.g., the output data signal SDQ0) as represented by waveform WD4 in FIG. 8E.

As already discussed with reference to FIGS. 7A to 7E, on the other hand, the semiconductor device 1 of this embodiment can precisely control the amount of current that flows through the output terminal TP because the gate-to-source voltage of each control transistor does not fluctuate even when the source voltage VDDQ and the ground voltage VSSQ fluctuate. This means that the semiconductor device 1 of the embodiment can precisely control the slew rate.

Also, the semiconductor device 1 of this embodiment includes the decoupling capacitor 36 of which one end is connected to the first source line L1 and the other end is connected to the second source line L2. In the semiconductor device 1 of the embodiment, it is possible to vary the source voltage VDDQ in accordance with changes in the potential level of the ground voltage VSSQ, so that the slew rate control signal SS which are output in accordance with the source voltage VDDQ can be varied with fluctuations of the potential level of the ground voltage VSSQ. Therefore, even if the potential level of the ground voltage VSSQ fluctuates, the gate-to-source voltage of each control transistor does not fluctuate in the semiconductor device 1 of the embodiment, making it possible to precisely control the amount of current that flows through the output terminal TP. This means that the semiconductor device 1 of the embodiment can precisely control the slew rate.

According to the present embodiment, the semiconductor device can generate a principal control signal (e.g., the pre-slew rate control signal) by a mode decoder control circuit (control circuit) which operates with a power supply that is independent of a power supply of an output control circuit. For example, in the semiconductor device of the present invention, a control signal generated by the mode decoder control circuit (control circuit) which operates on the source voltage supplied through a source line other than a source line for a driver circuit of the output control circuit is input into the driver circuit as a slew rate control signal through a buffer circuit which operates with the source voltage supplied through the same source line as that for the driver circuit, so that power supply noise that occurs in the first and second source lines also occurs in the slew rate control signal. This means that the semiconductor device of the present embodiment can reduce the influence of fluctuations in the source voltage caused by operation of the output control circuit when controlling the slew rate. In short, the semiconductor device of the embodiment can precisely control the slew rate.

Second Embodiment

A second embodiment of the present invention is now described below with reference to FIGS. 9 and 10. The following discussion does not include a description of such elements that have the same configuration as those of the above-described first embodiment.

Figure 9:
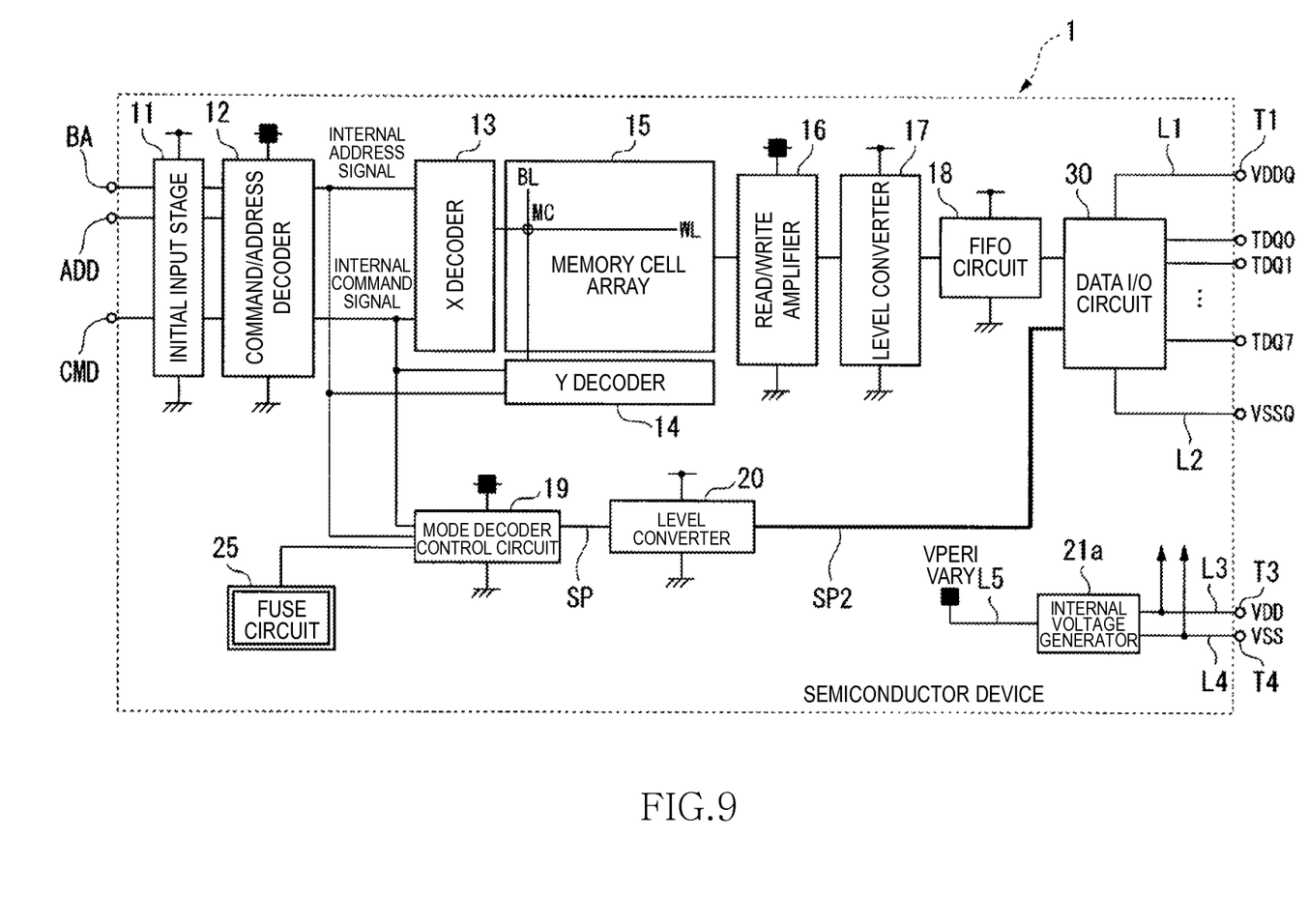
FIG. 9 is a block diagram indicative of the configuration of a semiconductor device according to a second embodiment of the present invention.

Referring now to FIG. 9, the semiconductor device 1 of this embodiment includes an internal voltage generator 21a, a level converter 20 (converter circuit) and a second level converter 17.

The internal voltage generator 21a, which is connected to the third source line L3 and the fourth source line L4, converts the source voltage VDD fed through the third source line L3 to a fifth source voltage VPERI (lowered voltage) and supplies the converted fifth source voltage VPERI to the mode decoder control circuit 19 (control circuit) as a source voltage for the command/address decoder 12, the read/write amplifier 16 and the mode decoder control circuit 19 (control circuit) through the fifth source line L5. In addition, the generator 21a generates an internal voltage VARY, which is then supplied to the cell array 15.

The second level converter 17 converts voltage levels of signals exchanged between the read/write amplifier 16 and the FIFO circuit 18.

The level converter 20 (converter circuit) converts the signal level of the pre-slew rate control signals SP having signal levels (e.g., amplitude) corresponding to the fifth source voltage VPERI and the ground voltage VSS into a signal level corresponding to the source voltage VDD and the ground voltage VSS. The level converter 20 operates on the source voltage VDD and the ground voltage VSS. If the level converter 20 (converter circuit) obtains an operating source power from the source voltage VDDQ and the ground voltage VSSQ, it will become impossible for the level converter 20 to exactly convert signal levels owing to noise contained in the source voltage VDDQ. Thus, the level converter 20 obtains the operating source power from the source voltage VDD and the ground voltage VSS which contain less noise compared to the source voltage VDDQ and the ground voltage VSSQ.

Also, the command/address decoder 12 and the read/write amplifier 16 of this embodiment operate with the fifth source voltage VPERI and the ground voltage VSS.

Figure 10:
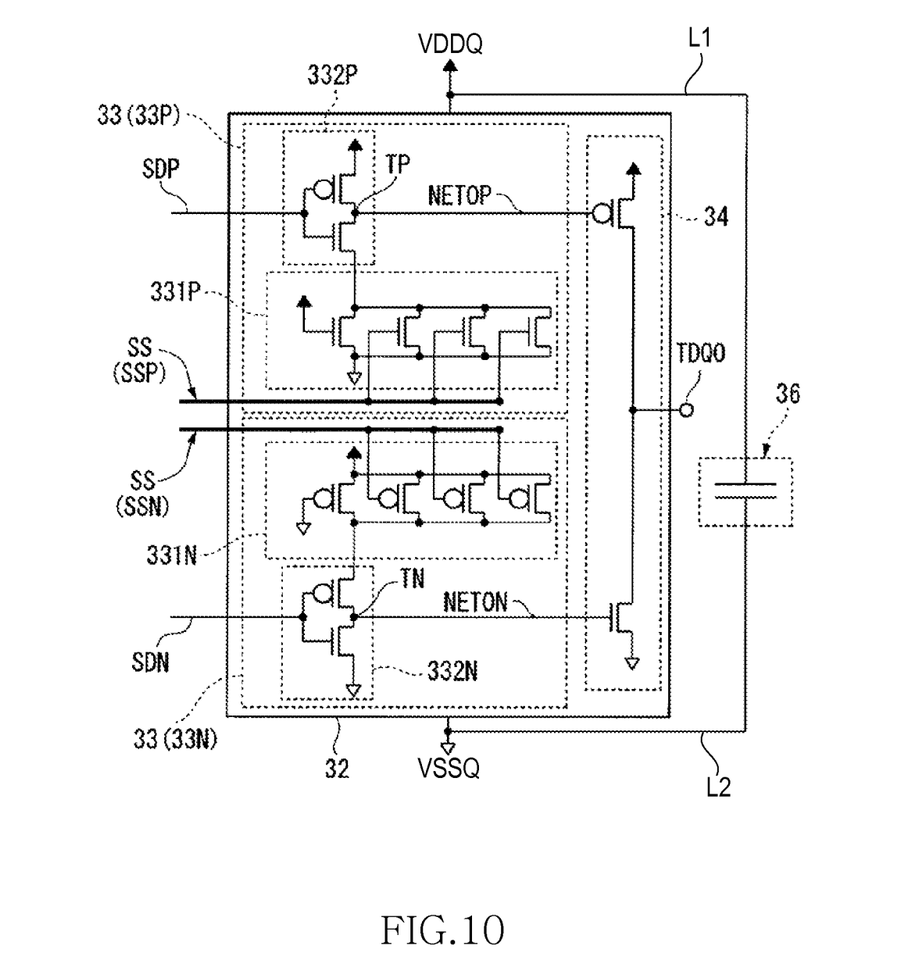
FIG. 10 is a block diagram indicative of the circuit configuration of the data input/output circuit shown in FIG. 9.

The data input/output circuit 30 of the semiconductor device 1 of this embodiment includes a decoupling capacitor as depicted in FIG. 10 which is a circuit diagram representing an example of the configuration of the data input/output circuit 30 of the semiconductor device 1 of the embodiment. It is to be noted that the control signals SSP and SSN are supplied from the buffer circuit 31 (see FIGS. 2 and 3) which operates on the power voltages VDDQ and VSSQ and receives the output signals SPP and SPN from the level converter 20 (see FIG. 9) operating on the power voltages VDD and VSS.

The decoupling capacitor 36 which is connected between the first source line L1 and the second source line L2 decouples the source voltage VDDQ and the ground voltage VSSQ from each other to stabilize a potential difference between the source voltage VDDQ and the ground voltage VSSQ. In a case where the ground voltage VSSQ rises, for example, the decoupling capacitor 36 of the embodiment causes the potential level of the source voltage VDDQ to rise in accordance with the potential level of the ground voltage VSSQ which has risen.

The semiconductor device 1 of this embodiment includes the internal voltage generator 21a as described above. The internal voltage generator 21a, which is connected to the third source line L3 and the fourth source line L4, converts the source voltage VDD fed through the third source line L3 into the fifth source voltage VPERI and supplies the converted fifth source voltage VPERI to the command/address decoder 12, the read/write amplifier 16 and the mode decoder control circuit 19 (control circuit) as the source voltage of the individual circuits. This arrangement of the semiconductor device 1 of this embodiment makes it possible to operate the command/address decoder 12, the read/write amplifier 16 and the mode decoder control circuit 19 (control circuit) at a lower voltage than the source voltage VDD, for example. The semiconductor device 1 of this embodiment can therefore reduce the amount of heat generated by these circuits. This means that the semiconductor device 1 of the embodiment can reduce power consumption as compared to a case where the aforementioned circuits are operated directly by the source voltage VDD.

While the preferred embodiments of the present invention have thus far been described with reference to the accompanying drawings, the invention is not limited to the foregoing embodiments in terms of specific configurations but may be modified in various ways without departing from the scope and spirit of the invention. Also, while the invention has been herein described on the assumption that the semiconductor device 1 is a dynamic random-access memory (DRAM), the invention is not limited thereto. For example, the semiconductor device 1 may be a device like a static random-access memory (SRAM), a phase-change RAM (PRAM) or a flash memory.

What is claimed is:

1. A device comprising:
an output terminal;
a driver circuit configured to drive the output terminal to one of first and second voltages supplied from first and second source lines, respectively;
a control circuit configured to generate a first control signal and operating on third and fourth voltages supplied from third and fourth source lines that are provided independently of the first and second source lines; and
a buffer circuit configured to receive the first control signal to generate a second control signal and operating on the first and second voltages supplied from the first and second source lines,
wherein the driver circuit is configured to control a slew rate thereof based on the second control signal.

2. The device as claimed in claim 1, wherein the control circuit is configured to generate the first control signal having one of the third and fourth voltages, and the buffer circuit is configured to generate the second control signal having one of the first and second voltages.

3. The device as claimed in claim 1, further comprising a decoupling capacitor having a first electrode connected to the first source line and a second electrode connected to the second source line.

4. The device as claimed in claim 1, further comprising:
a first external terminal connected to the first source line and configured to receive the first source voltage from outside;
a second external terminal connected to the second source line and configured to receive the second source voltage from outside;
a third external terminal connected to the third source line and configured to receive the third source voltage from outside; and
a fourth external terminal connected to the fourth source line and configured to receive the fourth source voltage from outside.

5. The device as claimed in claim 1, further comprising an internal voltage generator configured to receive a fifth source voltage from outside to generate the third source voltage.

6. The device as claimed in claim 1, wherein the first and third source voltages have substantially the same value as each other, and the second and fourth source voltages have substantially the same value as each other.

7. The device as claimed in claim 1, further comprising a fuse circuit storing the first control signal.

8. A device comprising:
an output terminal;
a first transistor coupled between the output terminal and a first source line;
a second transistor coupled between the output terminal and a second source line;
a first circuit configured to supply a first data signal to a control electrode of the first transistor, the first data signal taking one of first and second logic levels based on a third data signal;
a second circuit configured to supply a second data signal to a control electrode of the second transistor, the second data signal taking one of the first and second logic levels based on a fourth data signal;
a third circuit configured to control a changing speed of the first control signal from the first logic level to the second logic level based on a first slew rate control signal on a first signal line;
a fourth circuit configured to control a changing speed of the second control signal from the second logic level to the first logic level based on a second slew rate control signal on a second signal line;
a first buffer circuit configured to generate the first slew rate control signal such that the first signal line is connected to one of the first and second source lines; and
a second buffer circuit configured to generate the second slew rate control signal such that the second signal line is connected to one of the first and second source lines.

9. The device as claimed in claim 8, wherein
the first buffer circuit generates the first slew rate control signal based on a third slew rate control signal on a third signal line,
the second buffer circuit generates the second slew rate control signal based on a fourth slew rate control signal on a fourth signal line,
the third signal line is connected to one of third and fourth source lines,
the fourth signal line is connected to one of the third and fourth source lines, and
the third and fourth source lines are provided independently of the first and second source lines.

10. The device as claimed in claim 9, further comprising:
a first external terminal coupled to the first source line,
a second external terminal coupled to the second source line,
a third external terminal coupled to the third source line, and
a fourth external terminal coupled to the fourth source line.

11. The device as claimed in claim 10, wherein the first and third external terminals are supplied with a first voltage, and the second and fourth external terminals are supplied with a second voltage different from the first voltage.

12. The device as claimed in claim 9, further comprising a fuse circuit storing values of the third and fourth slew rate control signals.

13. A device comprising:
first and second terminals between which a first power voltage is supplied;
third and fourth terminals between which a second power supply voltage is supplied;
a fifth terminal;
a first circuit coupled between the first and second terminals and configured to operate on the first power voltage to produce a first set of slew rate control signals;
a second circuit coupled to between the third and fourth terminals and configured to operate on the second power voltage to produce a second set of slew rate control signals in response to the first set of slew rate control signals; and
a third circuit coupled between the third and fourth terminals and configured to operate on the second power voltage to drive the fifth terminal at a rate that is controllable in response to the second set of slew rate control signals.

14. The device as claimed in claim 13, further comprising:
first and second power lines elongated respectively from the first and second terminals to the first circuit; and
third and fourth power lines elongated respectively from the third and fourth terminals independently of the first and second power lines, the third and fourth power lines reaching each of the second and third circuits.

15. The device as claimed in claim 13, wherein the first power voltage is substantially equal to the second power voltage.

16. The device as claimed in claim 13, further comprising:
an internal voltage generator coupled between the first and second terminals and configured to operate on the first power voltage to generate an internal voltage that is different from the first power voltage; and
a fourth circuit operating on the internal voltage to produce a third set of slew rate control signals;
the first circuit responding to the third set of slew rate control signals to produce the first set of slew rate control signals.

17. The device as claimed in claim 16, wherein the internal voltage is lower than the first power voltage.

18. The device as claimed in claim 13, further comprising a capacitor connected between the third and fourth terminals.

19. The device as claimed in claim 13, wherein the second circuit comprises at least one inverter.

20. The device as claimed in claim 13, further comprising:
first and second power lines elongated respectively from the first and second terminals to the first circuit to convey the first power voltage to the first circuit; and
third and fourth power lines elongated respectively from the third and fourth terminals independently of the first and second power lines, the third and fourth power lines reaching each of the second and third circuits to convey the second power voltage to each of the second and third circuits;
the first power voltage being substantially equal to the second power voltage.

* * * * *